United States Patent
Hsu et al.

(10) Patent No.: US 6,218,863 B1
(45) Date of Patent: Apr. 17, 2001

(54) DUAL MODE INPUT/OUTPUT INTERFACE CIRCUIT

(75) Inventors: Pochang Hsu, Fremont, CA (US); Ravi Nagaraj, Lakeville, MN (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/290,520

(22) Filed: Apr. 12, 1999

(51) Int. Cl.[7] .............................................. H03K 19/0175
(52) U.S. Cl. ............................... 326/87; 326/87; 326/81; 326/83; 326/86; 326/21; 326/30; 326/62; 326/63
(58) Field of Search ................................ 326/21, 30, 62, 326/63, 81, 83, 85, 86, 87

(56) References Cited

U.S. PATENT DOCUMENTS

| | | |
|---|---|---|
| 5,023,488 | 6/1991 | Gunning . |
| 5,483,188 | 1/1996 | Frodsham . |
| 5,557,221 | 9/1996 | Taguchi et al. . |
| 5,563,542 | 10/1996 | Watarai . |
| 5,594,367 * | 1/1997 | Trimberger et al. .................. 326/41 |
| 5,606,275 | 2/1997 | Farhang et al. . |
| 5,703,811 | 12/1997 | Yoo et al. . |
| 5,801,554 | 9/1998 | Momma et al. . |
| 5,811,984 | 9/1998 | Long et al. . |
| 5,819,099 * | 10/1998 | Ovens ............................. 395/750.01 |
| 6,034,555 * | 3/2000 | Taguchi et al. ........................ 327/53 |
| 6,037,803 * | 3/2000 | Klein ................................... 326/86 |
| 6,049,221 * | 4/2000 | Ishibashi .............................. 326/30 |
| 6,075,379 * | 6/2000 | Haider et al. .......................... 326/21 |

* cited by examiner

Primary Examiner—Michael Tokar
Assistant Examiner—Vibol Tan
(74) Attorney, Agent, or Firm—Blakely, Sokoloff, Taylor & Zafman LLP

(57) ABSTRACT

A dual mode I/O interface circuit compatible with either GTL logic signals or traditional CMOS logic signals comprises a connection node with a differential sense amplifier having one input coupled to the connection node, and the other input coupled to a reference voltage. Pull-up and pull-down circuits are coupled to the connection node. Logic circuitry is coupled to the gate of the at least one P-type field-effect transistor of the pull-up circuit, and the gate of the at least one N-type field-effect transistor of the pull-down circuit to control the conductivity of the field-effect transistors. In this manner, a first representation of the input signal compatible with GTL logic signals as provided at the connection node when the mode signal is asserted, and a second representation of the input signal compatible with CMOS logic levels as provided at the connection node when the mode signal is deasserted.

23 Claims, 2 Drawing Sheets

DUAL MODE INPUT/OUTPUT INTERFACE CIRCUIT

FIELD OF THE INVENTION

The present invention relates generally to the field of integrated circuitry; more particularly, to interface circuits useful for transmitting input/output (I/O) signals between an integrated circuit (IC) and external chips or systems.

BACKGROUND OF THE INVENTION

There are many different types of output circuits and logic devices employed in semiconductor integrated circuits for driving transmission lines that carry communications between the circuits. In the past, emitter coupled logic (ECL), transistor-transistor logic (TTL) and complimentary metal oxide semiconductor (CMOS) logic levels were widely used for interchip input/output interfacing. As the transmission of high-speed data became more prevalent, designers developed output circuits that provided very small amplitude signals, thereby making it possible to transfer data at high speeds while overcoming problems with distortion, ringing, and the like.

For example, the Gunning Transceiver Logic (GTL) output circuit described in U.S. Pat. No. 5,023,488 drives transmission lines with a signal having a logical amplitude in the range from about 0.8 volts to 1.4 volts. Today, many information processing devices such as computers and workstations, which transfer information at high data rates across shared bus circuits, employ GTL output circuits for interconnection to the bus transmission lines. Despite its wide use, however, GTL circuitry does have drawbacks.

One of the problems associated with GTL circuits is the occurrence of "ringing" on the transmission lines. This problem, along with proposed solutions, is described in U.S. Pat. No. 5,563,542; and U.S. Pat. No. 5,483,188. The latter patent describes an improved phase-output driver in which the output transistors are connected to a delay element. By precisely ordering which transistors are turned on and off, and the time delay therebetween, the edge rate for the output signal is controlled to reduce ringing and other noise affects.

U.S. Pat. No. 5,606,275 teaches the use of an analog-to-digital (A/D) converter for adjusting the impedance of the output driver circuitry to match the characteristic impedance of the load, thus preventing ringing. The technique of varying impedance to match the characteristic impedance of a digital communication transmission line is also described in U.S. Pat. No. 5,811,984.

Another drawback of GTL circuitry is that it continuously requires direct current. The problem of high power dissipation in data output buffer circuitry is discussed generally in U.S. Pat. Nos. 5,703,811 and 5,819,099. More specifically, U.S. Pat. No. 5,801,554 teaches an improved GTL compatible circuit which attempts to overcome the problem of power consumption.

The problem of power consumption is even more critical for mobile applications such as notebook or mini-notebook computing devices. There remains a need for an I/O interface circuit that is compatible with GTL levels used in standard information processors such as desktop computers and workstations while overcoming the aforementioned problems associated with GTL circuits for mobile computer applications.

SUMMARY OF THE INVENTION

A dual mode I/O interface circuit is described that is compatible with either GTL logic signals or traditional CMOS logic signals. In one embodiment, the I/O circuit comprises a differential sense amplifier having one input coupled to a connection node, and the other input coupled to a reference voltage. A pull-up circuit includes at least one P-type field-effect transistor coupled between a positive supply potential and the connection node. Also included is a pull-down circuit that includes at least one N-type field-effect transistor coupled between the connection node and a negative supply potential or ground.

The interface circuit further comprises logic circuitry coupled to the gate of the at least one P-type field-effect transistor of the pull-up circuit, and the gate of the at least one N-type field-effect transistor of the pull-down circuit. The logic circuitry controls the conductivity of the field-effect transistors responsive to an input signal and also a mode signal, such that a first representation of the input signal compatible with GTL logic signals as provided at the connection node when the mode signal is asserted. A second representation of the input signal compatible with CMOS logic levels is provided at the connection node when the mode signal is deasserted.

BRIEF DESCRIPTION OF THE DRAWINGS

The present invention is illustrated by way of example, and not limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention.

For regular GTL operation, the interface circuit of the present invention reduces power dissipation and eliminates the external termination resistance typically found on the system motherboard. For mobile applications such as notebook or mini-notebook computing, in which power saving is critical, the invented interface circuit can be configured as an impedance controlled CMOS I/O buffer.

Figure 1:
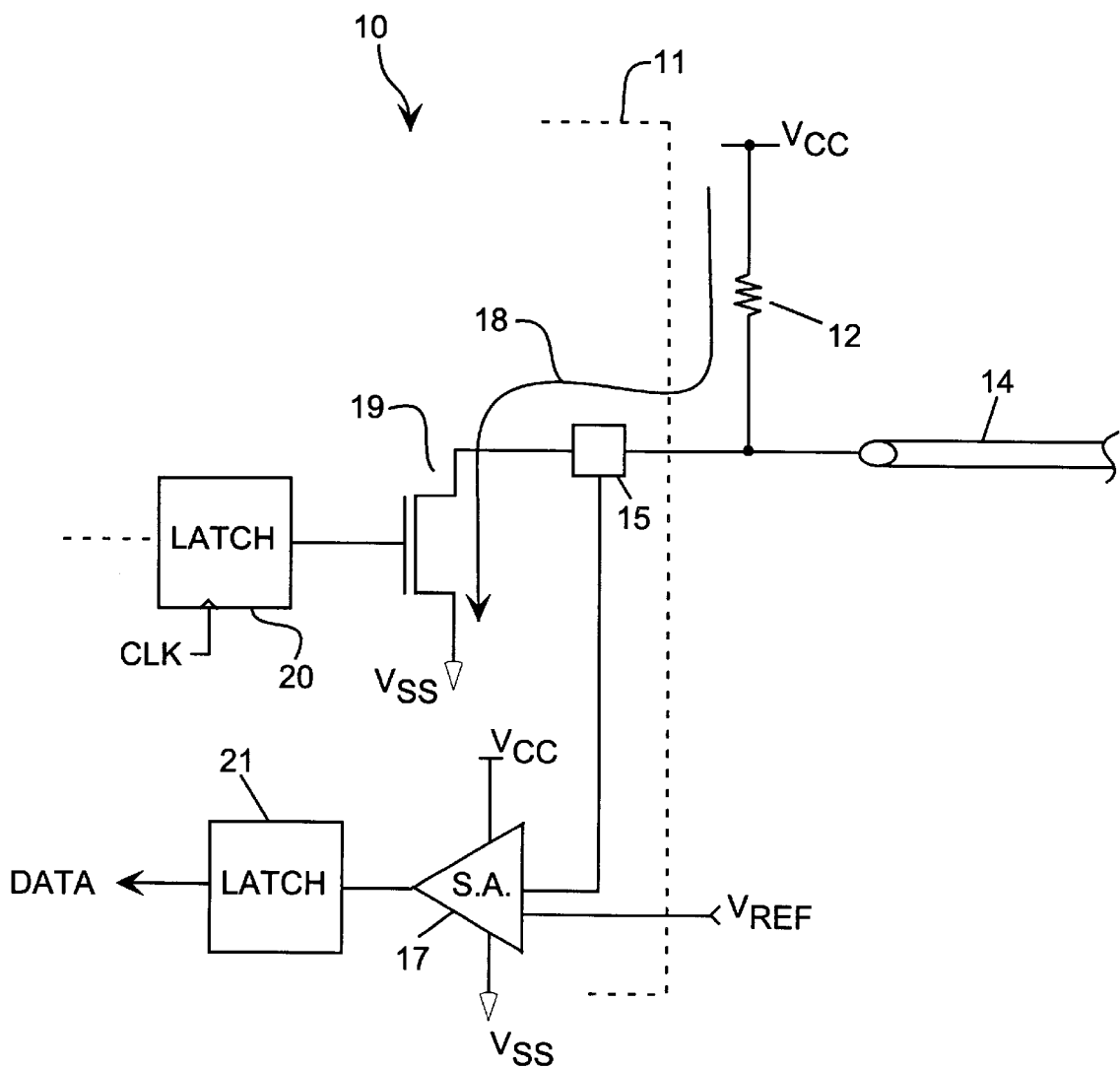
FIG. 1 illustrates a prior art I/O interface circuit.

With reference to FIG. 1, there is shown a portion of a prior art GTL I/O buffer 10 that has been widely used in integrated circuits for driving processor system busses. GTL I/O buffer 10 comprises an NMOS transistor 19 having its drain connected to the output pad 15 of integrated circuit 11. Output pad 15 represents the primary connection node of buffer 10 that is coupled to transmission line 14. The source of NMOS transistor 19 is coupled to $V_{SS}$, which is the negative supply potential (or ground) of the circuit. As shown, a clocked latch 20 drives the gate of NMOS transistor 19.

Also included in FIG. 1 is a differential sense amplifier 17 having one input coupled to pad 15 and the other input coupled to an external reference voltage, $V_{REF}$. The data output provided by sense amplifier 17 is stored in latch 21.

The GTL I/O buffer 10 of FIG. 1 is essentially a pull-down, open-drain transistor structure plus a pull-up termination resistor 12 coupled between pad 15 and the positive supply potential $V_{CC}$. Typically, resistor 12 resides on the system motherboard and has a value that is selected to match the characteristic impedance of transmission line 14. As explained previously, there are several disadvantages to the GTL interface circuit shown in FIG. 1. These disadvantages include the consumption of static power when the pull-down NMOS transistor 19 is turned on. This static DC current is illustrated in FIG. 1 by arrow 18, which shows current flowing from $V_{CC}$, through resistor 12, and through transistor 19 to $V_{SS}$.

In addition, the external pull-up resistor 12 may not always match the characteristic impedance of transmission line 14. Another problem with the prior art approach is that the external pull-up resistor 12 occupies space on the system motherboard, and further requires a short, stub connection to couple the resistor to the system bus. This stub connection typically causes multiple signal reflections.

Figure 2:
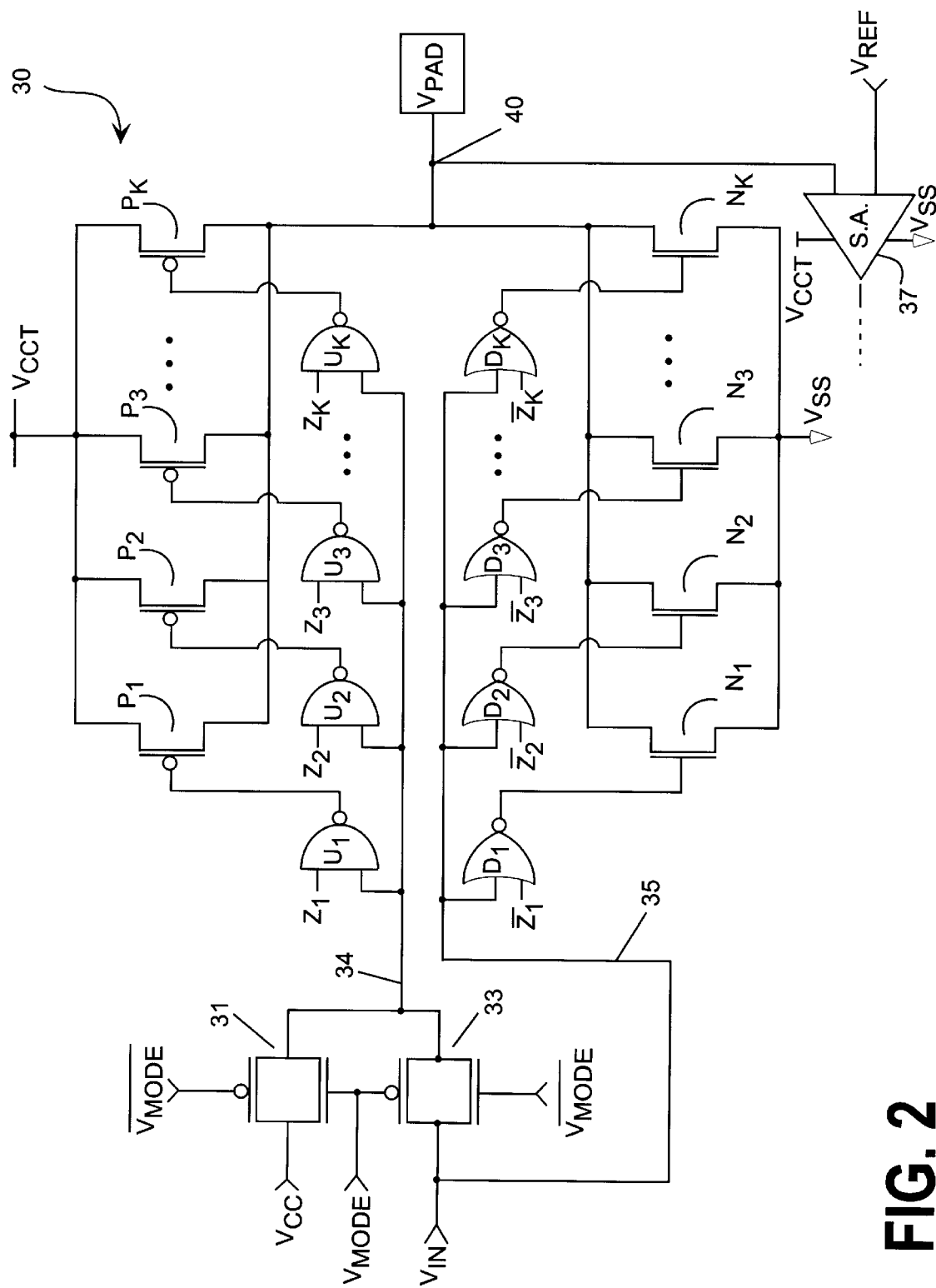
FIG. 2 is a detailed schematic diagram of one embodiment of the present invention.

With reference now to FIG. 2, there is shown one embodiment of the interface circuit 30 of the present invention. One of the important features of circuit 30 is that it can function either as a regular GTL interface circuit, with impedance control at the pull-down, or as an impedance-controlled CMOS buffer (for both pull-up and pull-down). The function of the output circuit depends upon the assertion of the mode signal $V_{MODE}$ labeled in FIG. 2. Details of the operation of the interface circuit 30 of FIG. 2 will be described shortly.

Interface circuit 30 comprises both pull-up and pull-down circuitry commonly coupled to the primary node 40, labeled $V_{PAD}$. The pull-up circuitry comprises a plurality of PMOS transistors $P_{1-k}$, which are coupled in parallel between positive supply potential $V_{CCT}$ and primary node 40. Each of the PMOS transistors has its gate coupled to the output of a corresponding NAND logic gate. That is, a given transistor $P_i$, where i is an integer ranging from 1 to k, has its gate coupled to the output of NAND gate $U_i$. Each of the NAND gates $U_i$ has one of its inputs coupled to node 34, and the other input coupled to a control signal $Z_i$. Configured in this manner, each of the PMOS transistors are selectively enabled by the logical combination of the voltage present at node 34 and the associated control signal $Z_i$. Thus, the individual impedance control signals $Z_{1-k}$ provide impedance control of the pull-up resistance at connection node 40.

Note that when $V_{MODE}$ is at a logical high level, a high positive voltage ($V_{CC}$) exists at node 34. This means that each of the impedance control signals $Z_i$ functions to turn on the corresponding transistor $P_i$ when $Z_i$ is at a high logical level. By selectively turning on and off certain ones of transistors $P_i$, interface circuit 30 functions as a regular GTL buffer with a terminated resistance (on chip), pulled up to $V_{CCT}$. Furthermore, the terminated resistance can be carefully controlled through the assertion/de-assertion of signal $Z_{1-k}$ so that the termination resistance matches the characteristic impedance of the transmission line it is driving.

Similarly, the pull-down circuitry of interface circuit 30 comprises a plurality of NMOS transistors $N_{1-k}$ coupled in parallel between primary node 40 and $V_{SS}$. Each NMOS transistor $N_i$ has its gate driven by the output of an associated NOR gate $D_i$ where i again ranges from 1 to k. One input of each of the NOR gates $D_i$ is coupled to the input signal provided at node 35. The other input of the NOR gate $D_i$ is coupled to the compliment of the control signal $Z_i$ (i.e., $Z_i$#). The control signals lines $Z_{1-K}$# function in exactly the same manner as described above with respect to the PMOS transistors; namely, the control signal $Z_i$# are utilized to selectively enable/disable each of the associated NMOS transistors $N_i$, thereby controlling the impedance of the open-drain connection.

Switching is achieved through a simple multiplexer structure comprising a pair of transmission gates 31 and 33 each having their outputs commonly coupled to node 34. The input of transmission gate 31 is coupled to the high positive supply potential $V_{CC}$, whereas the input to transmission gate 33 is coupled to the input signal $V_{IN}$. Each transmission gate 31 and 33 comprises a PFET coupled in parallel with an NFET device. In transmission gate 31, the PFET device has its gate coupled to the compliment of the mode signal, $V_{MODE}$# (the complement of $V_{MODE}$), as is also the case for the NFET of gate 33.

At the same time, the PFET of gate 33 and the NFET of gate 31 both have their gates coupled to the $V_{MODE}$ signal. Configured in this manner, when the $V_{MODE}$ signal is logically low, the voltage appearing at node 34 is the input signal $V_{IN}$. With $V_{MODE}$ deasserted, the entire interface circuit 30 functions as a regular CMOS driver (i.e., inverter) except that in the embodiment shown multiple, parallel-coupled PMOS and NMOS devices are used for impedance control. The control mechanism is the same as described above for the case of the regular GTL operations.

Note that for the case where circuit 30 functions as a CMOS driver, the output voltage swing is from $V_{SS}$ to $V_{CCT}$, since the positive supply is tied to $V_{CCT}$. With the control signal $V_{MODE}$ asserted (i.e., the default mode), circuit 30 functions as a regular GTL buffer with a terminated resistance pulled up to $V_{CCT}$.

As discussed above, the termination resistance for the GTL operation is implemented on the integrated circuit with multiple, parallel-coupled PMOS transistors. For improved resolution and impedance range, the channel widths of the PMOS transistors $P_{1-k}$ may vary. For example, the PMOS transistor $P_i$ may generally have a channel width of $2^{(i-1)}W_P$, where $W_P$ is the channel width of the first PMOS transistor, $P_1$. In other words, the channel width of each of the transistors varies as $W_P, 2W_P, 4W_P, \ldots, 2^{(k-1)}W_P$. The exact impedance values, of course, are dependent on the control signal $Z_i$.

The GTL pull-down may be implemented in similar fashion to the pull-up circuitry, with an inverted version of the control signal $Z_i$ providing impedance control. However, not like the pull-up devices, the pull-down path is not always on, and is dependent on the circuits input signal $V_{IN}$.

Also coupled to primary node 40 is one of the two inputs to sense amplifier 37. The other input of amplifier 37 is coupled to an external reference voltage $V_{REF}$.

Practitioners in the art will appreciate that circuit 30 advantageously saves space on the system motherboard by eliminating the external pull-up resistance needed during GTL operation. Also, point-to-point connection is achieved at the output, thereby reducing numerous paracidic effects that can degrade signal quality. Perhaps most importantly, is the elimination of the direct current path to ground for the GTL pull-down implementation.

Additionally, by providing dual mode signal driving capability, the dual mode interface circuit is compatible with both mobile applications where power concern is critical, and the more traditional desktop or workstation environment that most often relies on GTL compatible levels. For mobile applications, one can turn the dual mode circuit to its CMOS mode to save power.

We claim:

1. An input/output (I/O) circuit compatible with either a first type of logic signals or a second type of logic signals comprising:

a connection node;

a differential sense amplifier having one input coupled to the connection node and the other input coupled to a reference voltage;

a pull-up circuit that includes at least one p-type field-effect transistor coupled between a positive supply potential and the connection node;

a pull-down circuit that includes at least one n-type field-effect transistor coupled between the connection node and a negative supply potential or ground;

logic circuitry coupled to the gate of the at least one p-type field-effect transistor of the pull-up circuit and the gate of the at least one n-type field-effect transistor of the pull-down circuit, the logic circuitry controlling the conductivity of the field-effect transistors responsive to an input signal and a mode signal such that a first representation of the input signal compatible with the first type of logic signals is provided at the connection node when the mode signal is in a first state, and a second representation of the input signal compatible with the second type of logic signals is provided at the connection node when the mode signal is in a second state, and wherein the logic circuitry comprises a pair of transmission gates having a common output node coupled to the at least one p-type field-effect transistors, the pair of transmission gates being configured to respectively couple either the input signal, or a high potential, to the common output node responsive to the first or second states of the mode signal.

2. The I/O circuit of claim 1 wherein the first type of logic signals comprise CMOS signals.

3. The I/O circuit of claim 2 wherein the second type of logic signals comprise GTL signals.

4. The I/O circuit of claim 3 wherein the first state of the mode signal is a low logic state.

5. The I/O circuit of claim 4 wherein the second state of the mode signal is a high logic state.

6. An input/output (I/O) circuit compatible with either a first type of logic signals or a second type of logic signals comprising:

a primary node;

a differential sense amplifier having one input coupled to the primary node and the other input coupled to a reference voltage;

a multiplexer that provides an input signal at an output node responsive to a mode signal being in a first logic state, or a high potential at the output node responsive to the mode signal being in a second logic state;

a pull-up circuit that includes k PMOS transistors, where k is an integer, coupled in parallel between a positive supply potential and the primary node, the pull-up circuit further including k logic gates of a first type, an $i^{th}$ logic gate, where i ranges from 1 to k, having an output coupled to the gate of an $i^{th}$ PMOS transistor to control the conductivity therein, a first input coupled to the output node, and a second input coupled to an $i^{th}$ control signal such that a logical combination of the $i^{th}$ control signal and a voltage level at the output node selectively enables the $i^{th}$ PMOS transistor;

a pull-down circuit that includes k NMOS transistors coupled in parallel between the primary node and a negative supply potential or ground, the pull-down circuit further including k logic gates of a second type, an $i^{th}$ logic gate of the second type having an output coupled to the gate of an $i^{th}$ NMOS transistor to control the conductivity therein, a first input coupled to the input signal, and a second input coupled to a complement of the $i^{th}$ control signal such that a logical combination of the complement of the $i^{th}$ control signal and the input signal selectively enables the $i^{th}$ NMOS transistor;

the I/O circuit providing a first representation of the input signal compatible with the first type of logic signals at the primary node when the mode signal is in the first logic state, and a second representation of the input signal compatible with the second type of logic signals at the primary node when the mode signal is in the second logic state.

7. The I/O circuit of claim 6 wherein the first type of logic signals comprise CMOS signals.

8. The I/O circuit of claim 7 wherein the second type of logic signals comprise GTL signals.

9. The I/O circuit of claim 6 wherein the multiplexer comprises a pair of transmission gates controlled by the mode signal.

10. The I/O circuit of claim 8 wherein the first logic state of the mode signal is a low logic state.

11. The I/O circuit of claim 10 wherein the second logic state of the mode signal is a high logic state.

12. The I/O circuit of claim 6 wherein the k logic gates of a first type comprise NAND logic gates.

13. The I/O circuit of claim 6 wherein the k logic gates of a second type comprise NOR logic gates.

14. The I/O circuit of claim 6 wherein the k PMOS transistors each have different channel widths, such that selectively enabling the k PMOS transistors controlling an impedance at the primary node.

15. The I/O circuit of claim 6 wherein the k NMOS transistors each have different channel widths, such that selectively enabling the k NMOS transistors controlling an impedance at the primary node.

16. A dual mode input/output (I/O) interface circuit providing compatibility with either GTL or CMOS logic comprising:

a primary node;

a differential sense amplifier having one input coupled to the primary node and the other input coupled to a reference voltage;

a multiplexer that provides an input signal at an output node when a mode signal is in a first logic state, or a high potential at the output node when the mode signal is in a second logic state;

a pull-up circuit that includes k PMOS transistors, where k is an integer, coupled in parallel between a positive supply potential and the primary node, the pull-up circuit further including k NAND gates, an $i^{th}$ NAND gate, where i ranges from 1 to k, having an output coupled to the gate of an $i^{th}$ PMOS transistor, a first input coupled to the output node, and a second input coupled to an $i^{th}$ control signal such that a logical combination of the $i^{th}$ control signal and a logic level at the output node selectively enables the $i^{th}$ PMOS transistor;

a pull-down circuit that includes k NMOS transistors coupled in parallel between the primary node and a negative supply potential or ground, the pull-down circuit further including k NOR gates, an $i^{th}$ NOR gate having an output coupled to the gate of an $i^{th}$ NMOS transistor, a first input coupled to the input signal, and a second input coupled to a complement of the $i^{th}$ control signal such that a logical combination of the complement of the $i^{th}$ control signal and the input signal selectively enables the $i^{th}$ NMOS transistor;

wherein the I/O interface circuit produces a complement of the input signal at the primary node compatible with GTL or CMOS logic when the mode signal is in the second or first logic states, respectively.

17. The I/O interface circuit of claim 16 wherein the multiplexer comprises first and second transmission gates, each including a PFET connected in parallel with a NFET, the gate of the NFET of the first transmission gate and the gate of the PFET of the second transmission gate both being coupled to the mode signal, the gate of the PFET of the first transmission gate and the gate of the NFET of the second transmission gate both being coupled to a complement of the mode signal.

18. The I/O interface circuit of claim 16 wherein the first logic state of the mode signal is a low logic state.

19. The I/O interface circuit of claim 18 wherein the second logic state of the mode signal is a high logic state.

20. The I/O interface circuit of claim 16 wherein the k PMOS transistors each have different channel widths, such that selectively enabling the k PMOS transistors controlling an impedance at the primary node.

21. The I/O interface circuit of claim 16 wherein the k NMOS transistors each have different channel widths, such that selectively enabling the k NMOS transistors controlling an impedance at the primary node.

22. The I/O interface circuit of claim 16 wherein the $i^{th}$ PMOS transistor has a channel width of $2^{(i-1)} W_P$, where $W_P$ is a channel width of a first PMOS transistor.

23. The I/O interface circuit of claim 16 wherein the $i^{th}$ NMOS transistor has a channel width of $2^{(i-1)} W_N$, where $W_N$ is a channel width of a first NMOS transistor.

* * * * *